Ill1111111111111111111111111111111111111111111111111111111111111111111111111
US009472511B2

(12) United States Patent
Lee et al.

(10) Patent No.: US 9,472,511 B2
(45) Date of Patent: Oct. 18, 2016

(54) ESD CLAMP WITH A LAYOUT-ALTERABLE TRIGGER VOLTAGE AND A HOLDING VOLTAGE ABOVE THE SUPPLY VOLTAGE

(71) Applicant: Cypress Semiconductor Corporation, San Jose, CA (US)

(72) Inventors: Sungkwon Lee, Saratoga, CA (US); Roger Bettman, Los Altos, CA (US); Sai Prashanth Dhanraj, San Jose, CA (US); Dung Ho, Sunnyvale, CA (US); Leo F Luquette, Jr., Monument, CO (US); Iman Rezanezhad Gatabi, Sunnyvale, CA (US); Andrew Walker, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/560,135

(22) Filed: Dec. 4, 2014

(65) Prior Publication Data
US 2015/0200168 A1     Jul. 16, 2015

Related U.S. Application Data

(60) Provisional application No. 61/928,235, filed on Jan. 16, 2014, provisional application No. 62/027,440, filed on Jul. 22, 2014.

(51) Int. Cl.
| *H01L 23/60* | (2006.01) |
| *H01L 29/78* | (2006.01) |
| *H01L 29/08* | (2006.01) |
| *H01L 29/861* | (2006.01) |
| *H01L 29/739* | (2006.01) |

(Continued)

(52) U.S. Cl.
CPC ........... *H01L 23/60* (2013.01); *H01L 29/0847* (2013.01); *H01L 29/0878* (2013.01); *H01L 29/7391* (2013.01); *H01L 29/7816* (2013.01); *H01L 29/7835* (2013.01); *H01L 29/8611* (2013.01); *H01L 27/027* (2013.01); *H01L 29/0649* (2013.01); *H01L 29/0653* (2013.01); *H01L 29/1045* (2013.01); *H01L 2924/0002* (2013.01)

(58) Field of Classification Search
CPC .............................. H01L 23/60; H01L 23/62
USPC .................................................. 257/173, 360
See application file for complete search history.

(56) References Cited

U.S. PATENT DOCUMENTS

| 6,078,487 A | 6/2000 | Partovi et al. |
| 6,204,537 B1 | 3/2001 | Ma |

(Continued)

OTHER PUBLICATIONS

Ker, Ming-Dou, "ESD Protection Consideration in Nanoscale CMOS Technology," 11th IEEE International Conference on Nanotechnology, Aug. 15-18, 2011, p. 720-723; 4 pages.

(Continued)

*Primary Examiner* — Selim Ahmed

(57) ABSTRACT

An ESD device that includes a gate and an n-drain region isolated from the gate and formed at least partially within an n-well region, which in turn is formed at least partially within a deep n-well region. The doping levels of the n-drain region, the n-well region and the deep n-well region are in a descending order. The ESD device has trigger and holding voltages, above the operation voltage of its protected circuit, which are layout-configurable by altering the distance between the n-drain and a side edge of the n-well region.

20 Claims, 19 Drawing Sheets

(51) Int. Cl.
  *H01L 27/02*   (2006.01)
  *H01L 29/06*   (2006.01)
  *H01L 29/10*   (2006.01)

(56) References Cited

U.S. PATENT DOCUMENTS

| | | | |
|---|---|---|---|
| 6,594,132 B1* | 7/2003 | Avery | H01L 27/0262 361/111 |
| 6,674,129 B1 | 1/2004 | Colclaser et al. | |
| 6,680,493 B1 | 1/2004 | Wolf et al. | |
| 6,885,529 B2 | 4/2005 | Ker et al. | |
| 7,381,603 B2 | 6/2008 | Hossain et al. | |
| 7,838,940 B2 | 11/2010 | Schneider et al. | |
| 8,008,726 B2 | 8/2011 | Jou et al. | |
| 8,492,834 B2 | 7/2013 | Lai et al. | |
| 8,582,258 B1 | 11/2013 | Luo et al. | |
| 2002/0008287 A1 | 1/2002 | Czech et al. | |
| 2005/0111150 A1 | 5/2005 | Jang et al. | |
| 2005/0285200 A1* | 12/2005 | Kim | H01L 27/0266 257/360 |
| 2009/0140335 A1* | 6/2009 | Schneider | H01L 29/0847 257/344 |
| 2012/0098046 A1 | 4/2012 | Kim | |
| 2012/0199874 A1 | 8/2012 | Salcedo et al. | |
| 2014/0151745 A1 | 6/2014 | Dai | |

OTHER PUBLICATIONS

Ker, Ming-Dou, "Whole-Chip ESD Protection for CMOS VLSI/ULSI With Multiple Power Pins," IEEE Integrated Reliability Workshop, 1994 Final Report., Oct. 16-19, 1994, pp. 124-128; 5 pages.

Lin, Kun-Hsien, "Design on Latchup-Free Power-Rail ESD Clamp Circuit in High-Voltage CMOS ICs," Electrical Overstress/Electrostatic Discharge Symposium Proceedings, Sep. 19-23, 2004, pp. 4B.4.1-4B.4.8; 8 pages.

International Search Report for International Application No. PCT/US15/11593 dated Sep. 1, 2015; 2 pages.

Written Opinion of the International Searching Authority for International Application No. PCT/US2015/11593 mailed Sep. 1, 2015; 7 pages.

\* cited by examiner

ESD CLAMP WITH A LAYOUT-ALTERABLE TRIGGER VOLTAGE AND A HOLDING VOLTAGE ABOVE THE SUPPLY VOLTAGE

PRIORITY

The present application claims the priority and benefit of U.S. Provisional Application No. 61/928,235, filed on Jan. 16, 2014 and U.S. Provisional Application No. 62/027,440, filed on Jul. 22, 2014, which are both incorporated by reference herein in their entirety.

TECHNICAL FIELD

This disclosure relates to the field of electrostatic discharge (ESD) circuits and, in particular, to ESD circuits that have a holding voltage above the supply voltage.

BACKGROUND

As is well known in the microelectronics industry, integrated circuit devices may be susceptible to damage from application of excessive voltages, for example, ESD events. In particular, during an ESD event, charge transferred within a circuit may develop voltages that are large enough to break down insulating films (e.g. gate oxides) on the device or dissipate sufficient energy to cause electrothermal failures in the device. Such failures may include contact spiking, silicon melting, or metal interconnect melting. As such, protection circuits are often connected to Input/Output (I/O) bonding pads of an integrated circuit to safely dissipate energy associated with ESD events away from active circuitry. Protection circuits may also be connected to power supply pads or between power supply buses to prevent damage to active circuitry. In developing effective ESD protection circuitry, circuit designers may, however, be limited with regard to the particular structures used, since the protection circuit will often be closely associated with the remainder of the integrated circuit that it is intended to protect. For instance, integrated circuits which operate with applications of high voltages (e.g., $V_{DD}$>12V) may include protection circuitry configured to accommodate high voltage levels.

One of the solutions for an ESD protection circuit or ESD clamp is to have a protection-designated high voltage drain extended metal-oxide semiconductor (DEMOS) transistor coupled to the I/O bonding pads or any node to be protected. The DEMOS usually further consists of a silicon-controlled rectifier (SCR) which is triggered/turned on by an ESD zap to provide a low resistant path for the high voltage discharge, thus protecting the node.

FIG. 1 illustrates a cross-sectional view of an ESD clamp 50 incorporating a SCR circuit 52 of an example of such circuits. Referring to FIG. 1, the characteristic P-N-P-N structure of SCR circuit 52 is formed by the P+ region, the N-well/Deep N-well, the P-substrate and the N+ source. In one embodiment, P+ region is coupled to the protected node and the N+ source is coupled to a voltage low node or a ground node. During an ESD event, the SCR circuit 52 is triggered to drain the current associated with the ESD zap in order to protect the node. It is imperative to state that ESD clamp 50 is one of many embodiments of ESD protection circuit incorporating SCR.

FIG. 2 illustrates a plot of current as a function of voltage of an ESD device incorporating SCR such as ESD clamp 50. When the ESD device is used for ESD protection, the N+ drain and P+ contact region are connected to the $V_{dd}$ power pad or the node to be protected. While the gate, the N+ source, and the P+ collection region are all tied together and connected to a $V_{ss}$ ground pad, thus turning the DEMOS off as a transistor. Referring to FIG. 2, curve A represents a response to a first ESD event for an ESD device incorporating SCR such as ESD clamp 50. In an embodiment, curve A may also represent the response to subsequent ESD events. During regular operation, the current going through ESD device 50 is very minimal as the device is off (gate connected to a ground pad). However, during an ESD zap, when the supply voltage reaches/exceeds the trigger voltage of ESD device 50, SCR 52 is turned on and starts to conduct and provide a discharging path to drain current associated with the ESD zap in order to protect the node and the circuit it is connected. Subsequent to the turn on of the SCR 52, the device will experience a snapback to a holding voltage, which is much lower than the trigger voltage. In this stage, the ESD device 50 will provide an extremely low impedance discharging path to supply voltage (latch on). In the event that the holding voltage is lower than the supply voltage in regular operational conditions, SCR 52 and ESD device 50 may remain "on" and continue to provide a low impedance discharging path to drain current even after the ESD event. In one embodiment, this ESD false-triggering phenomenon will lead to permanent damages to ESD device 50. Referring still to FIG. 2, Curve B represents a leakage current of ESD device 50 associated with ESD events described in Curve A. After each ESD event, the leakage current, specifically at 36V for Curve B, is measured and monitored to determine if ESD device 50 is damaged.

The main challenge is to design an ESD device that has a high holding voltage such that the ESD device will be back to the "off" state after an ESD event to sustain protection to the node.

BRIEF DESCRIPTION OF THE DRAWINGS

The present disclosure is illustrated by way of example, and not by way of limitation, in the FIGS. of the accompanying drawings.

DETAILED DESCRIPTION

Figure 1:
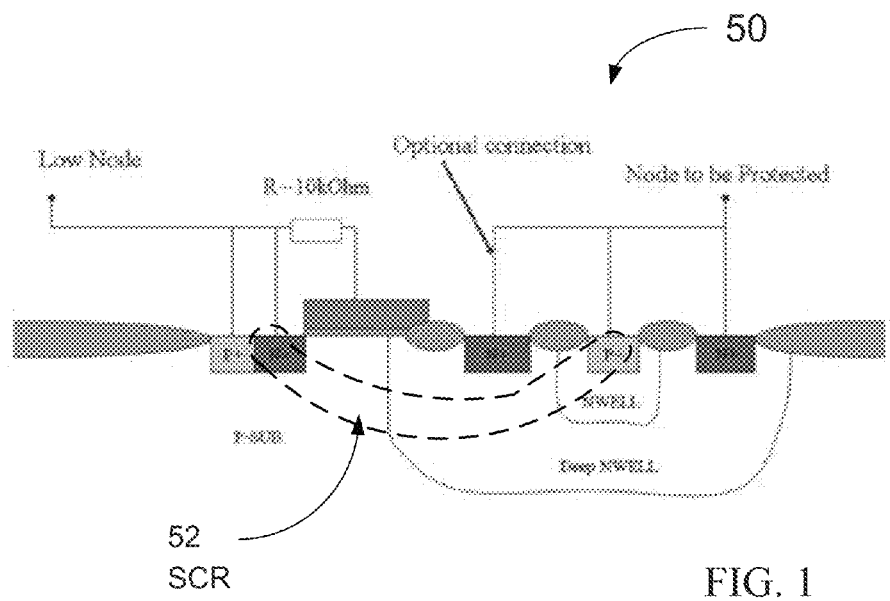
FIG. 1 illustrates a cross-sectional view of a semiconductor structure configured to provide protection from electrostatic discharge, in accordance with an embodiment that incorporates SCR structure.

The following description sets forth numerous specific details such as examples of specific systems, components, methods, and so forth, in order to provide a good understanding of several embodiments of the present invention. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Reference in the description to "an embodiment", "one embodiment", "an example embodiment", "some embodiments", and "various embodiments" means that a particular feature, structure, or characteristic described in connection with the embodiment(s) is included in at least one embodiment of the invention. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

A circuit with electrostatic discharge (ESD) protection is described herein. In the following description, numerous specific details are set forth, such as structural arrangements, in order to provide a thorough understanding of embodiments of the present invention. It will be apparent to one skilled in the art that embodiments of the present invention may be practiced without these specific details. In other instances, well-known fabrication operations, such as deposition and patterning operations, are not described in detail in order to not unnecessarily obscure embodiments of the present invention. Furthermore, it is to be understood that the various embodiments shown in the FIGS. are illustrative representations and are not necessarily drawn to scale.

In accordance with an embodiment of the present invention, a lateral diffused metal-oxide semiconductor (LDMOS) transistor is a MOS transistor having a drain contact region that is laterally displaced apart from the channel of the transistor at a greater distance than the source contact region is relative to channel. Such a configuration may be implemented in a variety of manners, some examples of which are shown in and described below in reference to FIGS. 3-4B and 7A-14B. An LDMOS transistor may be alternatively referenced as a drain extended MOS (DEMOS) transistor and, as such, the terms DEMOS and LDMOS may used interchangeably. Moreover, the term "ESD device", "ESD clamp" and "ESD protection circuit" and the likes may used interchangeably to describe a device designed to provide protection to a power node, I/O pad or a node to be protected from ESD events.

In designing ESD device, two important parameters to consider are the trigger voltage at which the ESD device triggers or turned on; and the holding voltage, which defines the voltage below which the ESD device no longer conducts after an ESD event and thus avoids latch up. In one embodiment, the trigger voltage and holding voltage of an ESD device are configured according to the circuit it is protecting. In general, the trigger voltage may be less than the breakdown voltage of the protected circuit and the holding voltage may be higher than the operational voltage of said circuit to avoid false-triggered ESD and latch on.

Figure 2:
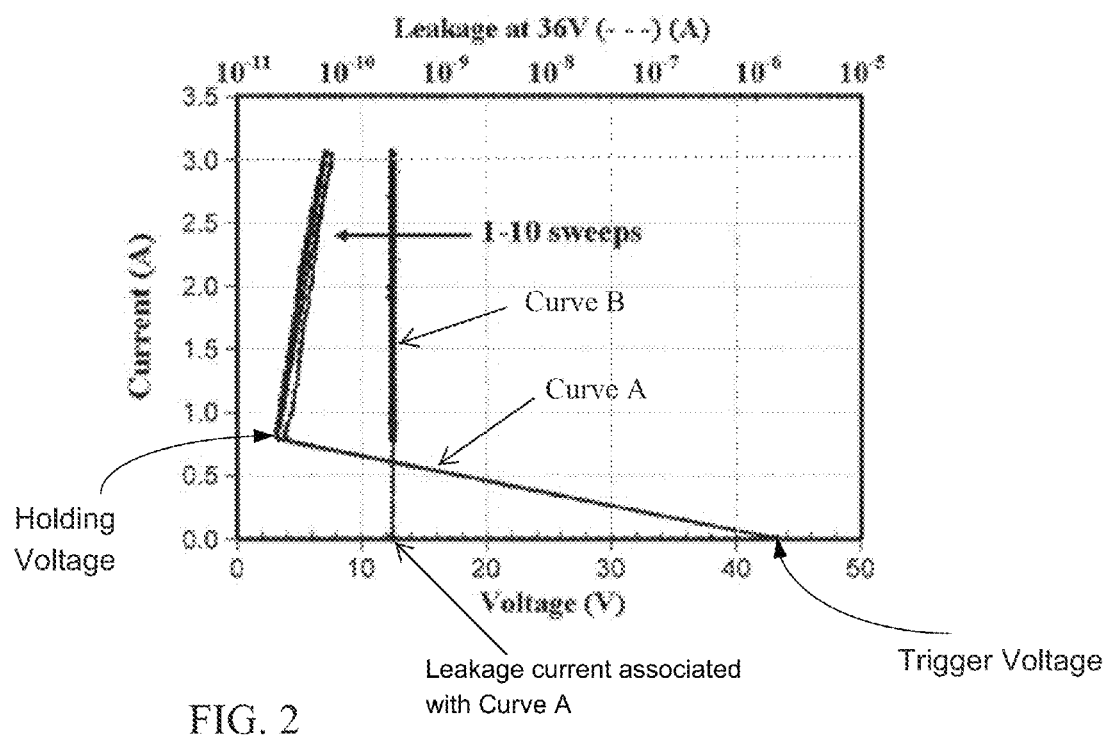
FIG. 2 illustrates a plot of current as a function of voltage for semiconductor structures configured to provide protection from electrostatic discharge, in accordance with an embodiment of FIG. 1.

One approach in providing ESD protection for integrated circuits may be to employ a silicon-controlled rectifier (SCR) type structure for transferring charge away from the protected node. However, in one embodiment, ESD clamps with SCR may exhibit a low snapback holding voltage, as illustrated in FIG. 2. As such, ESD clamps with SCR may not provide enough protection to circuits with high operational voltage. For example, universal serial bus (USB) power delivery circuits may have an operational voltage up to 35V. Moreover, such a configuration may rely on drain breakdown of the device in order to trigger/turn on the SCR. In some embodiments, triggering the SCR in such a manner may not be fast enough to prevent the protected circuit transistor(s) from being damaged and, therefore, may not be effective for many applications. In other embodiments, a SCR is incorporated within protection circuitry coupled to I/O bonding pads of an integrated circuit. In some embodiments, a protection-designated DEMOS transistor may further be included in the protection circuitry to trigger the SCR. In general, however, such configurations may have limited controllability of the trigger and holding voltages of the SCR due to snapback. As a consequence, the level of ESD protection offered by such designs may be limited.

Figure 3:
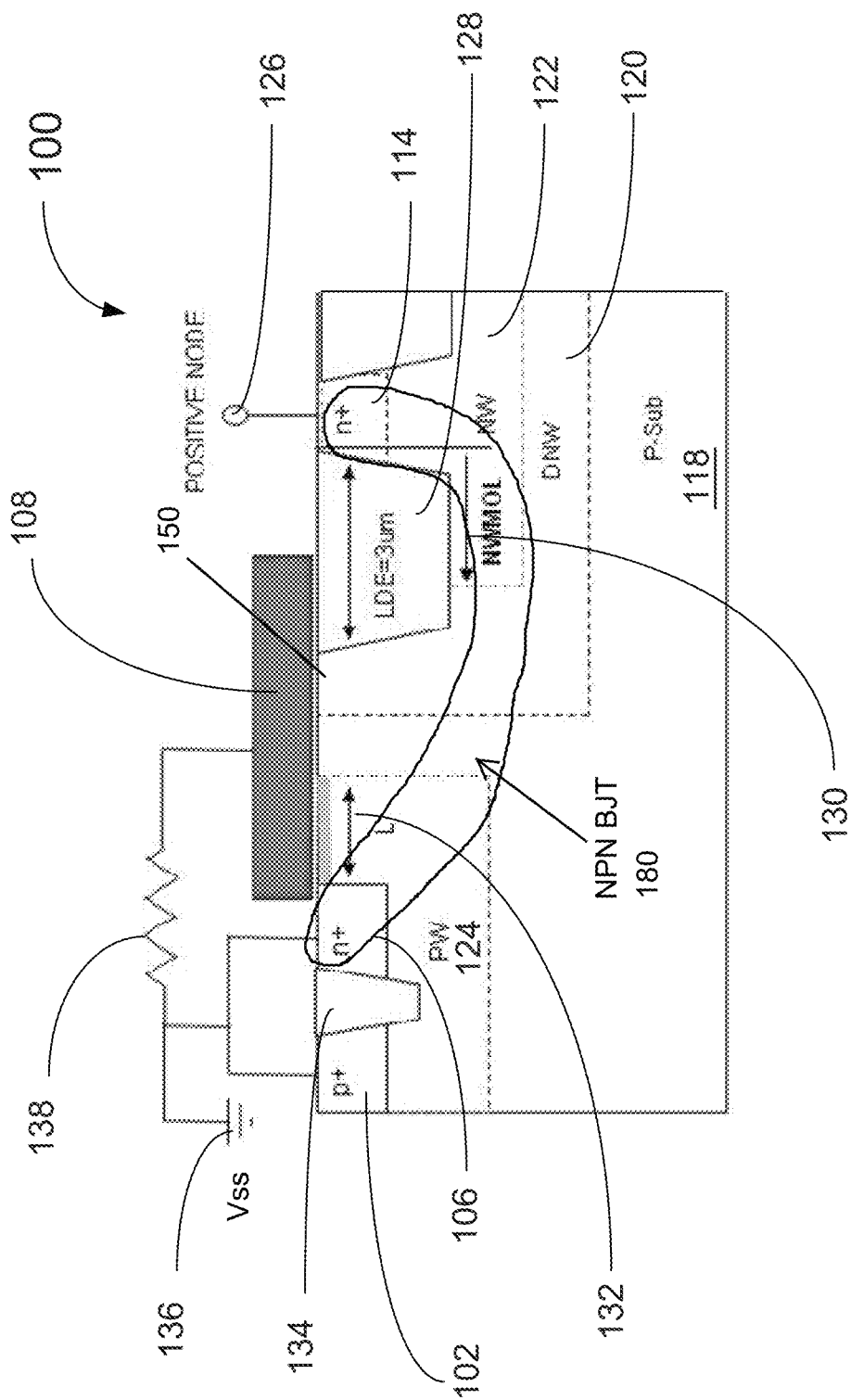
FIGS. 3 and 4A illustrates a cross-sectional view of a semiconductor structure configured to provide protection from ESD, in accordance with an embodiment of the present invention.

FIG. 3 illustrates an ESD clamp and its connection in accordance with an embodiment of the present invention. Referring to FIG. 3, in one embodiment, ESD clamp 100 device is a transistor based device resembling a N-channel DEMOS transistor that includes source contact region 106, gate 108, extended drain contact region 114 and P+ collection region 102. As will be described in more detail below, in an embodiment, such components are collectively configured and arranged to transfer charge associated with ESD events from a bus coupled to node 126 to a bus coupled to low power supply $V_{SS}$ or ground node 136 via source region 106. In one embodiment, gate 108 is coupled to low power supply $V_{SS}$ or ground node 136, optionally via resistor 138. The low gate voltage turns ESD clamp off as a transistor and thus providing a high impedance path to node 126 during regular operation. The bus coupled to node 126 is further coupled to an active circuit (not shown) which ESD clamp 100 protects. Accordingly, in one embodiment, diverting charge from the bus coupled to node 136 may prevent excessive charge from accessing the active circuit during an ESD event. In one embodiment, ESD clamp 100 is capable to protect high voltage active circuits such as USB power delivery circuit which has high operational voltage (up to approximately 35V and beyond) and drain more than 10 A current during an ESD event.

Figure 4A:
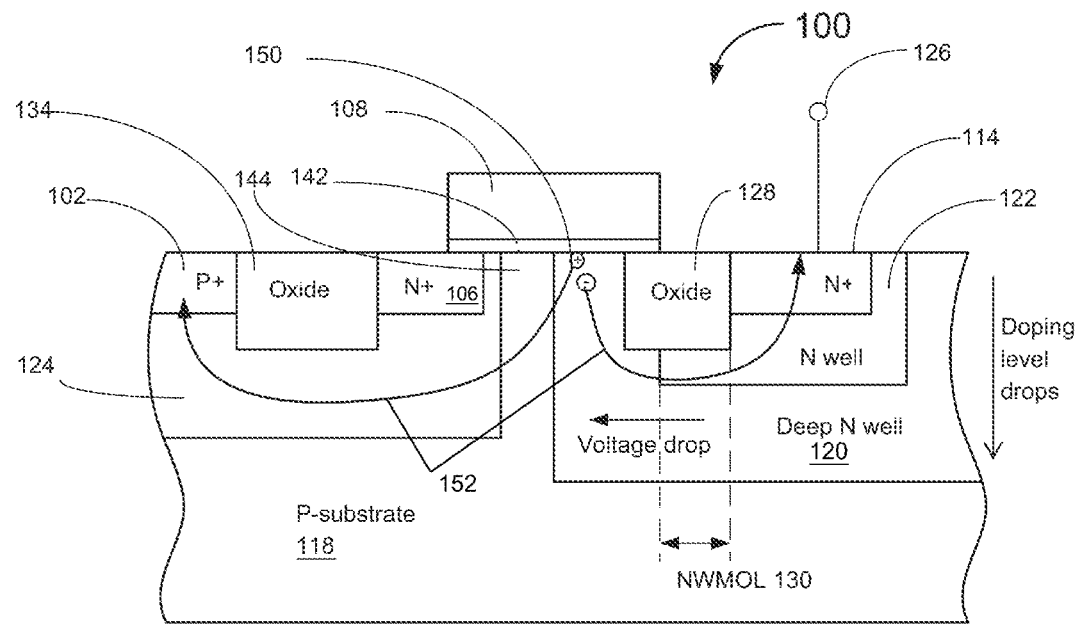

As illustrated in FIGS. 3 and 4A, ESD clamp 100 includes gate 108 and gate oxide 142 disposed above P-substrate 118. The materials and dimensional characteristics of gate 108, gate oxide 142, and P-substrate 118 may include any of those known in the semiconductor fabrication industry for MOS transistors and FET. In one embodiment, P-substrate 118 is a lightly doped substrate or epitaxial layer (e.g., doped with a relatively light net concentration of electrically active p-type impurities) and, thus, has a relatively low degree of conductivity. For example, in a specific embodiment, a doping level of P-substrate 118 is generally less than or equal to approximately $2.0 \times 10^{15}$ atoms per cm$^3$.

As is also illustrated in FIG. 4A, in an embodiment, ESD clamp 100 further includes drain contact region 114 and source contact region 106 disposed within P-substrate 118 on opposing sides of gate 108. As used herein, the terms "drain contact region" and "source contact region" may generally refer to the diffusion regions within the semiconductor substrate at which contact is made to allow current flow to and from the transistor. Due to the specific reference of contact being made to the regions, the terms "drain contact region" does not generally include lighter doped regions which is interposed between drain and gate edge region. Rather, in an embodiment, lighter doped drain extension region is added only in the drain side and the drain contact is made on highly doped n+ region to form ohmic contact. It is noted that any of the configurations of DEMOS transistors described herein (e.g., those transistors included in devices which are configured to provide active LDMOS output driver transistors protection from ESD events) may include sidewall spacers or lightly doped drain region extending from gate sidewalls and, consequently, the ESD clamps described herein are not necessarily limited to the illustrations of FIGS. 3-4B, 7A-14B. For instance, ESD clamp 100 may, in some embodiments, include sidewall spacers or lightly doped region extending from the sidewalls of gate 108 with respect to the drain contact region 114.

In an embodiment, drain contact region 114 and source contact region 106 each includes a net concentration of electrically active n-type impurities dopants, which are opposite of P-substrate 118. In one embodiment, both drain contact region 114 and source contact region 106 are heavily doped with a doping level generally in the approximate range of $1.0 \times 10^{20}$ to $5.0 \times 10^{21}$ atoms per cm$^3$. As illustrated in FIG. 4A, drain contact region 114 may be laterally displaced away from channel region 144 at a farther distance than source contact region 114 such that a DEMOS transistor is formed. In an embodiment, a channel region 144 generally refers to the region under gate 108 and gate oxide 142 which is of opposite conductivity type from source and drain contact regions 106 and 114 prior to the application of a threshold voltage to gate 108 and is of the same conductivity type as source and drain contact regions 106 and 114 upon application of threshold voltage to gate 108 which allows the conduction of current through the transistor. In one embodiment, drain contact region 114 is spaced apart from gate 108 by field oxide isolation structure 128 to displace drain contact region 114 farther away from channel region 144 than source contact region 106, as depicted in FIGS. 3 and 4A. In one embodiment, field oxide isolation structure 128 is fabricated to extend beyond the side wall of gate 108 and beneath a portion of gate oxide 142. In other embodiments, field oxide isolation structure 142 is omitted from ESD protection circuit 100 and an alternative technique for displacing drain contact region 114 from channel region 144 is used. Other displacement techniques which may be employed include the use of sidewall spacers or isolation structures along gate 108. In yet other embodiments, a temporary masking layer is placed adjacent to gate 108 and dopants are implanted into the semiconductor topography such that drain contact region 114 is formed in a designated position relative to gate 108.

In one embodiment, drain contact region 114 is disposed at least partly within a intermediately-doped N-type well region, such as depicted by N well region 122 in FIG. 4A. The intermediately doped N well region 122 may have a doping level generally in the approximate range of $3.0 \times 10^{17}$ to $4.0 \times 10^{17}$ atoms per cm$^3$. In one embodiment, the N well region 122 is formed at least partially within a lightly doped deep N-type well region, such as depicted by deep N well region 120. The lightly doped deep N well region 120 may have a doping level generally in the approximate range of $2.0 \times 10^{16}$ to $3.0 \times 10^{16}$ atoms per cm$^3$ and is disposed within lightly doped P-substrate 118. In one embodiment, the increased drain-to-substrate junction area provided by well regions 122 and 120, along with the reduced dopant concentration at the drain-to-substrate junction, greatly increases the junction breakdown voltage to permit higher voltage operation of ESD clamp 100. In one embodiment, deep N well region 120 may be fabricated to extend beyond the sidewall of gate 108 and beneath a portion of gate oxide 142. As illustrated in FIG. 4A, field oxide isolation structure 128 is disposed partly in N well region 122 and partly in deep N Well region 120. In one particular embodiment, for ESD clamp 100 to have an operation voltage up to approximately 35V and beyond and due to safe operation area and hot carrier injection (HCl) reliability limit, the approximate length for field oxide isolation structure 128 is in the approximate range of 3 μm. In other embodiments, the length of field oxide isolation structure may be adjusted to achieve different operational range for ESD clamp 100. In an embodiment, the distance field oxide isolation structure 128 overlaps with N well region 122 which otherwise is the distance between the side wall of drain contact region 114 and the edge of N well region 122 adjacent to gate 108, denoted in FIGS. 3 and 4A as N well overlap length (NWMOL) 130. As will be described in more detail below, in an embodiment, NWMOL 130 may be set to at least partially affect the holding voltage and trigger voltage of ESD clamp 100. In one embodiment, the relationship between NWMOL length 130 and the trigger and holding voltage of ESD clamp 100 makes the trigger and holding voltage layout-alterable.

As will be explained in details later, the charge associated with a gate induced drain leakage (GIDL) event generated within ESD clamp 100 during an ESD event may be collected at P+ collection region 102, which in turn is coupled to low power supply $V_{SS}$ or ground node 136 to dissipate the GIDL charge. As with the other contact regions of ESD clamp 100, P+ collection region 102 may, in some embodiments, include cladding layer thereon to reduce resistance of the connections to $V_{SS}$ 136. In an embodiment, P+ collection region 102 is P-type heavily doped that may have a doping level generally in the approximate range of $1.0 \times 10^{20}$ to $1.0 \times 10^{21}$ atoms per $cm^3$. As illustrated in FIG. 4A, P+ collection region 102 is shown spaced apart from source contact region 106, isolated by field oxide 134 or may be butted up against one another in another embodiment (P+ collection region 102 and source contact region 106). In one embodiment, P+ collection region 102, source field oxide 134 and source contact region 106 are all disposed at least partially within an intermediately doped P-type well region, such as depicted in P well region 124. The intermediately doped P well region 124 may have a doping level generally in the approximate range of $1.0 \times 10^{17}$ to $2.0 \times 10^{17}$ atoms per $cm^3$ and is disposed within P-substrate 118. In one embodiment, P well region 124 and source contact region 106 may be fabricated to extend beyond the sidewall of gate 108 and beneath a portion of gate oxide 142.

Figure 4B:
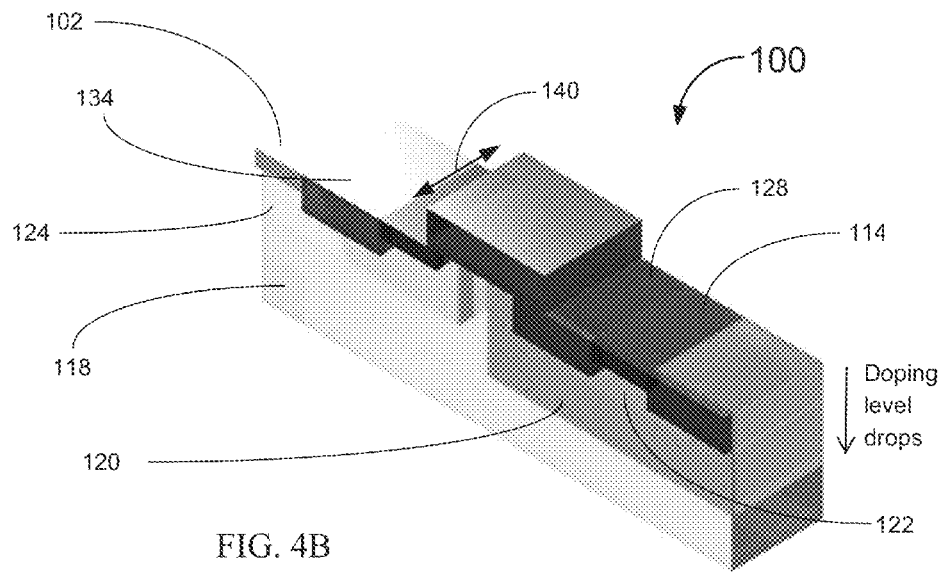
FIG. 4B illustrates an isometric view thereof.

FIG. 4B illustrates a representative isometric view of ESD clamp 100 in accordance with an embodiment of the present invention. In one embodiment, the drain current limit during an ESD event of ESD clamp 100 is proportional to the width 140 of the device 100. In one embodiment, $I_{ESD}$ (ESD current) is approximately 2.5 mA per μm of the width 140 of ESD clamp 100.

Figure 4C:
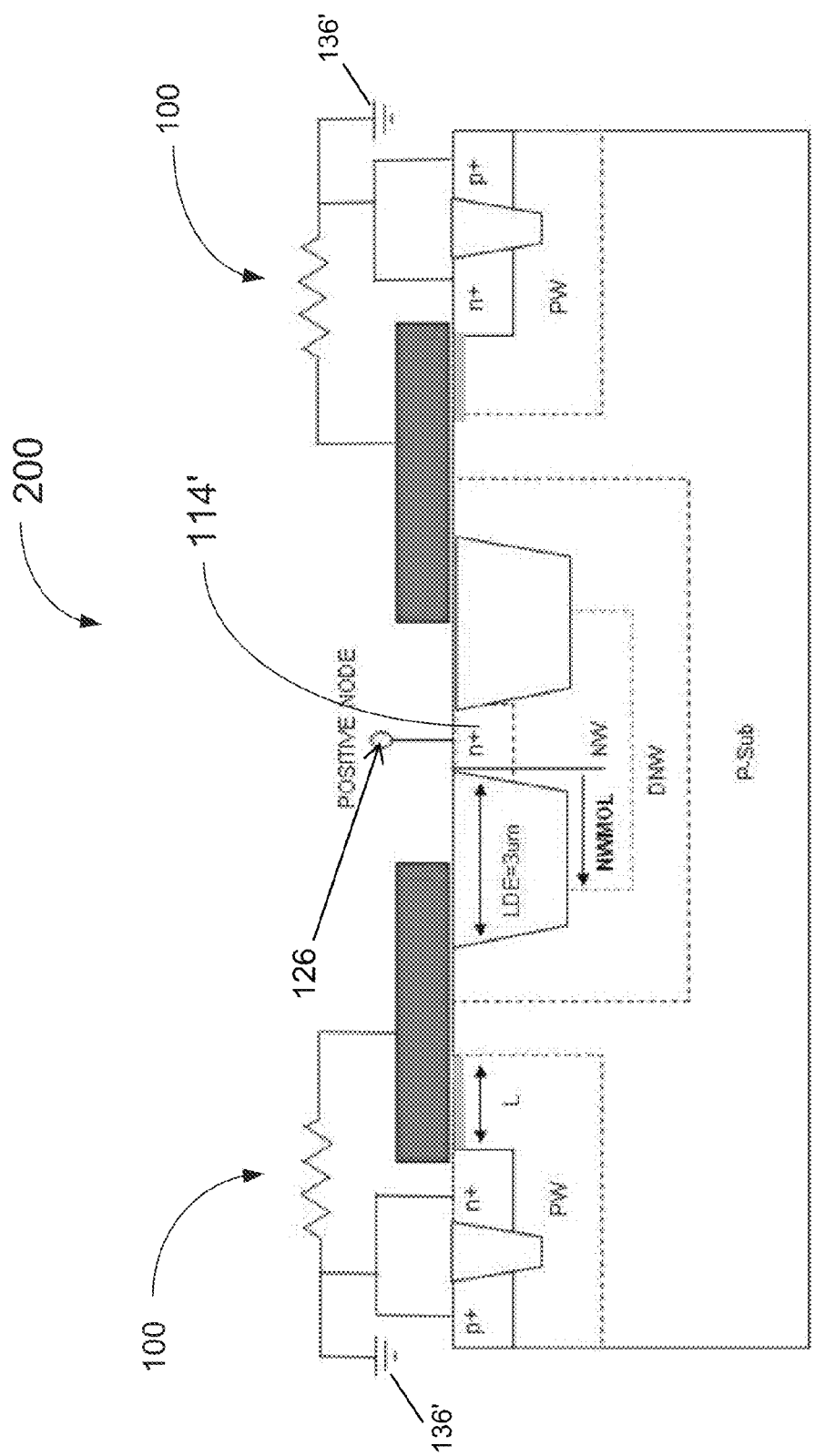
FIG. 4C illustrates a cross-sectional view of a semiconductor structure including two DEMOS, in accordance with an embodiment of the present invention.

FIG. 4C illustrates a cross-sectional view of an alternative embodiment of ESD protection device 200, in accordance with an embodiment of the present invention. As illustrated in FIG. 4C, ESD protection device 200 includes two ESD clamps 100, as depicted in FIGS. 3 and 4A, disposed side by side and connected paralleled between common drain contact region 114' and ground nodes 136'. In one embodiment, common drain contact region 114' is coupled to node 126.

It is important to note that some applications require silicon chip to withstand 15 kV ESD usually applied as an air discharge. In addition, the chip may need to withstand 8 kV ESD applied as a contact discharge to a package pin of the chip. Such system level ESD zaps are fully described in the International Electrotechnical Commission (IEC) specification number 61000-4-2. In these cases, the ESD clamps have to be sized accordingly so that they can conduct a high level of ESD current. In one embodiment, ESD clamp 100 and other embodiments described herein may be configured to meet those high amperes requirements.

Figure 5A:
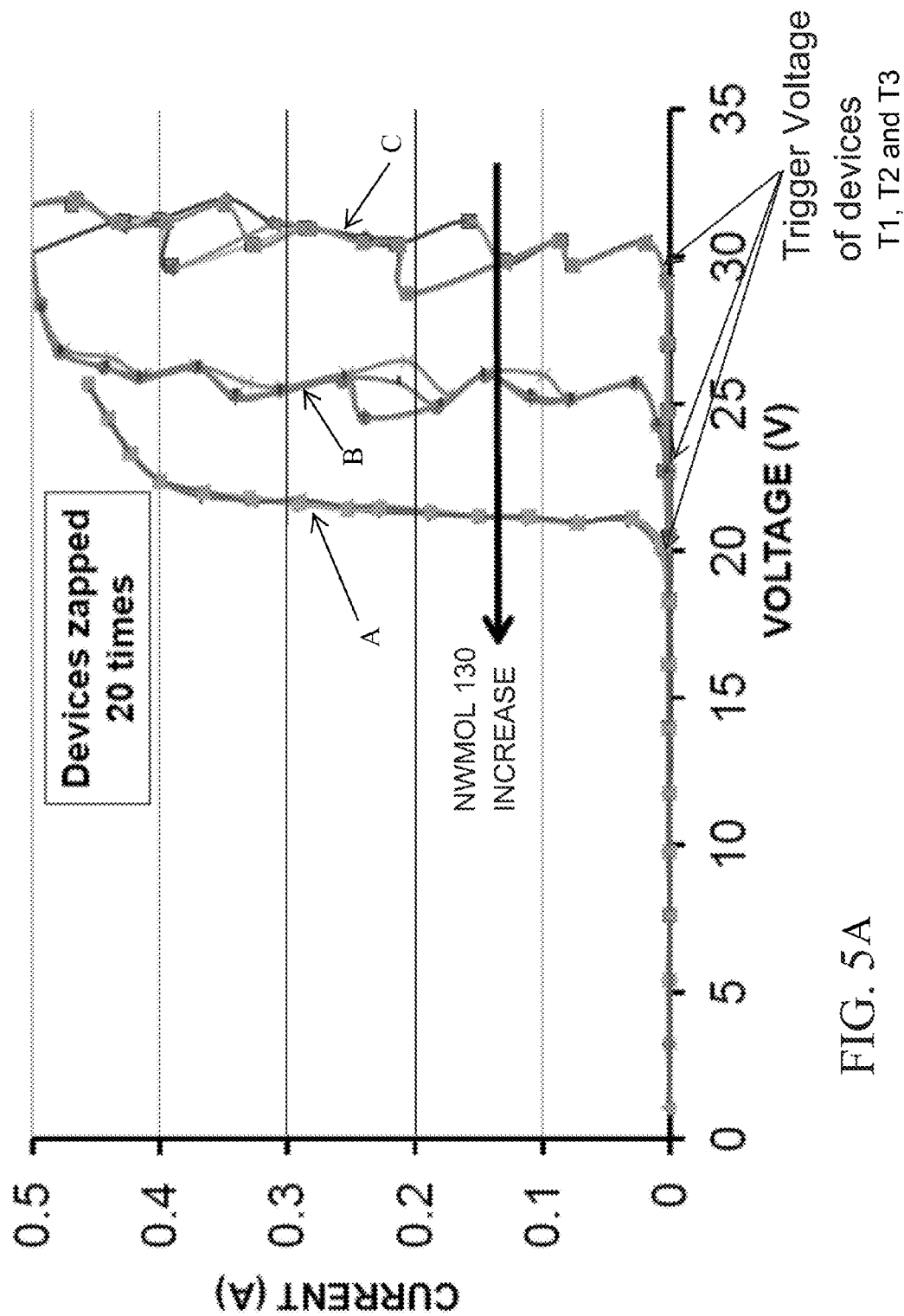
FIG. 5A illustrates a plot of current as a function of voltage for a semiconductor structures configured to provide protection from ESD, in accordance with an embodiment of the present invention.

FIG. 5A illustrates a plot of current as a function of voltage for a semiconductor structure configured to provide protection from ESD, in accordance with an embodiment of the present invention. As is also illustrated in FIG. 3, source contact region 106, gate 108, and P+ collection region 102 are coupled to low power supply $V_{SS}$ or ground node 136. In contrast, in an embodiment, drain contact region 114 is coupled to node 126, which in turn is coupled to a bus further coupled to a high voltage signal pad or a high voltage power supply or any circuit to be protected. As explained above, since gate 108 is coupled to low voltage supply $V_{SS}$ 136, ESD clamp 100 is perpetually in a first, high-impedance "OFF" state and drains minimal current from node 126. In the first state, any voltage that is applied to node 126 of the integrated circuit in excess of the high voltage power supply $V_{DD}$ but below the threshold trigger level of ESD clamp 100 will not cause large leakage currents to be drawn through ESD clamp 100. Instead, current will flow towards the protected circuit as intended during a normal operation. However, in an embodiment, ESD events are not considered part of the "normal" operation. When there is a spike in voltage at node 126 which is coupled to drain contact region 114 due to an ESD event, ESD clamp will be triggered or turned on. Curves A, B and C of FIG. 5A represent how ESD clamp 100 may respond to a spike of supply voltage at node 126 that exceeds the trigger voltage. As illustrated in FIG. 5A, considering Curve A, when supply voltage reaches trigger voltage T1, ESD clamp 100 is turned on providing an extremely low impedance drainage path for current associated with the ESD event. However, unlike what is depicted in FIG. 2, ESD clamp 100 demonstrates virtually no snapback when ESD clamp 100 is operated within its operational range. As a result, the holding voltage of ESD clamp 100 is much higher and approximates the trigger voltage. As illustrated in FIGS. 3 and 4A, ESD clamp 100 is specifically designed not to include any SCR device or PNPN structure. As a result, ESD clamp 100 does not demonstrate behavior of a SCR device, in particular snapback when the trigger voltage is reached. In one embodiment, the trigger voltage of ESD clamp 100 may be adjusted by altering NWMOL 130. Curves A, B and C represent behavior of three ESD clamps 100, which has different NWMOL 130, during ESD events. As depicted in FIG. 5A, the trigger and holding voltages of ESD clamp 100 decreases as NWMOL 130 increases. In one embodiment, users can configure NWMOL 130 of ESD clamp 100 to determine trigger voltage such that the trigger voltage and the holding voltage are both higher than the operation voltage of the protected circuit. As such, after an ESD event, the operation voltage which is the supply voltage at node 126 does not false-trigger ESD clamp 100. In one embodiment, the trigger voltage of ESD clamp 100 is selected to be lower than the breakdown voltage of the protected circuit. As such, during an ESD event, ESD clamp 100 is turned on before the breakdown voltage is reached to spare the protected node/active circuit.

Figure 5B:
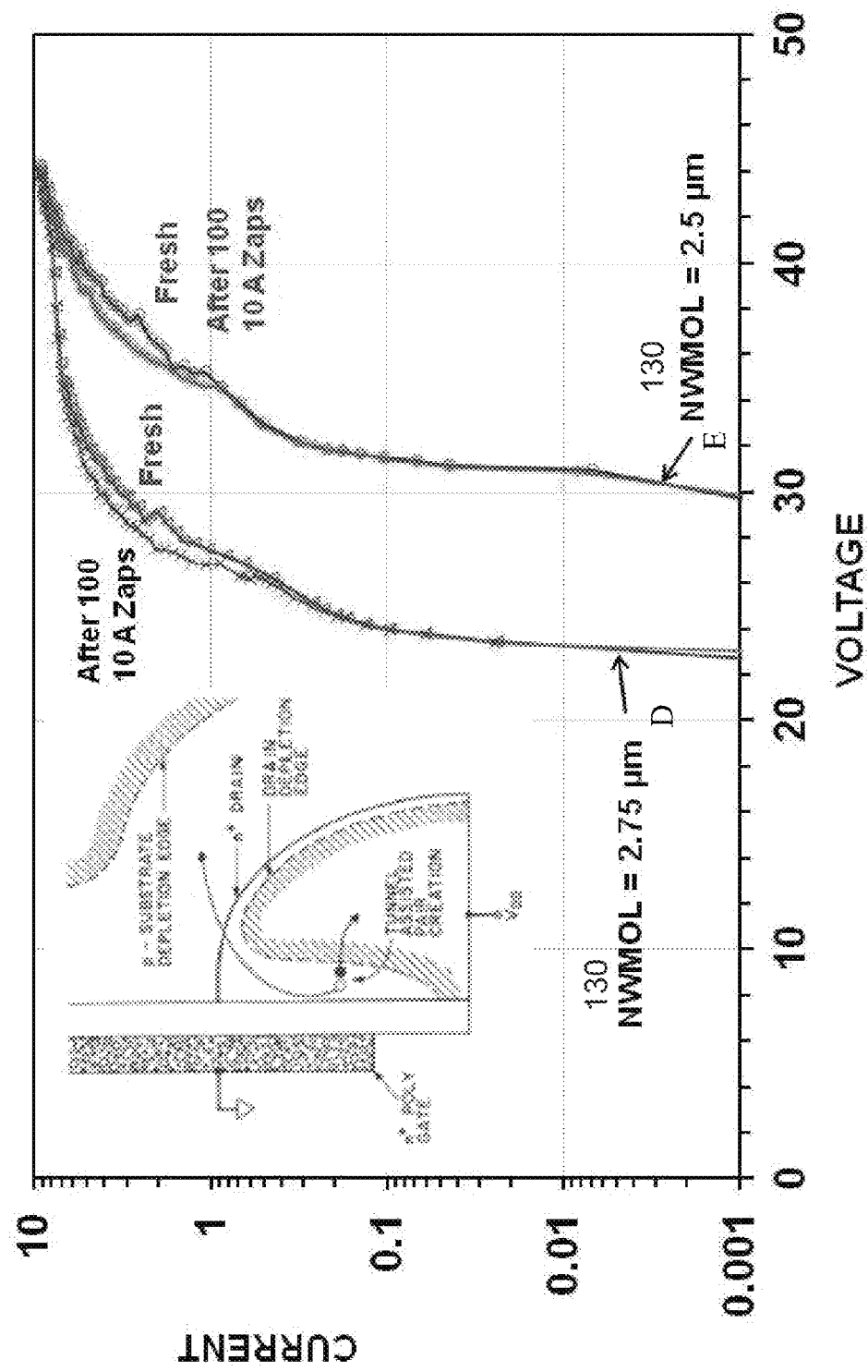
FIG. 5B illustrates a plot of current as a function of voltage after multiple ESD zaps for a semiconductor structures configured to provide protection from ESD, in accordance with an embodiment of the present invention.

FIG. 5B illustrates a plot of current as a function of voltage for a semiconductor structures configured to provide protection from ESD, in accordance with an embodiment of the present invention. As shown in FIG. 5B, after 100 10 A ESD zaps, ESD clamp 100 demonstrates good consistency after multiple ESD zaps which shows high robustness of ESD clamp 100. As also illustrated in FIG. 5A, Curve D and Curve E depicted the behavior of ESD clamp having NWMOL 2.75 μm and 2.5 μm respectively. Again, trigger voltage and holding voltage of ESD clamp 100 increases as NWMOL 130 decreases.

Referring to Curve A in FIG. 5A, once ESD clamp 100 is triggered at around 20V at T1 as it changes from a high impedance device to an extremely low impedance drainage path for swift dissipation of charge associated with an ESD event. In one embodiment, during an ESD event, charge goes from the high voltage $V_{DD}$ node 126 to the low voltage $V_{SS}$ or ground node 136 through ESD clamp 100 when GIDL current turns on a NPN bipolar junction transistor (BJT) structure 180 which is formed by drain contact region 114 (collector), P-substrate 118/P well region 124 (base) and source contact region 106 (emitter), as best illustrated in FIG. 3. Moreover, due to a voltage drop by drain extension resistance, during an ESD event, the supply voltage at $V_{DD}$ would be less likely to exceed the gate oxide breakdown voltage of ESD clamp 100. ESD clamp 100 demonstrates good robustness after repeated ESD zaps, as best illustrated in FIG. 5B. In one embodiment, as explained above, ESD clamp 100 also does not depend on a SCR structure to dissipate charge during an ESD event.

Figure 6:
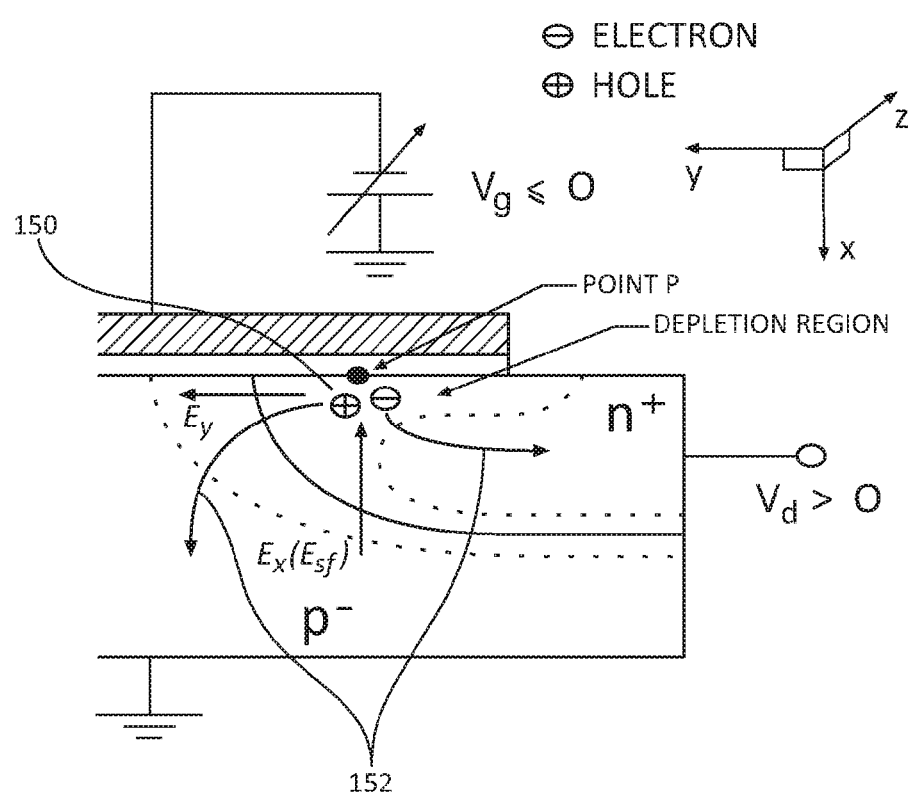
FIG. 6 illustrates a representative schematic of gate induced drain leakage (GIDL) phenomenon.

In one embodiment, the onset of ESD clamp 100 trigger (e.g. T1 of Curve A in FIG. 5A) and subsequent high current discharge path may be explained by the gate induced drain leakage (GIDL) effect happening at gate edge region 150. In one embodiment, gate edge region 150 is beneath gate oxide 142 where channel 144 overlaps deep N well region 120, as depicted in FIG. 4A. FIG. 6 is a representative view illustrating an embodiment of GIDL mechanism. GIDL is an off-state leakage current mechanism. When drain contact region 114 is connected to a positive bias (node 126) and gate 108 is in the vicinity of zero bias or to a negative bias ($V_{SS}$ or ground node), Gate edge region 150 under gate 108 is depleted and even inverted under the influence of vertical electric field. As a result, when the supply voltage at drain contact region 114 is high enough (trigger voltage), electrons move towards drain contact region 114 as GIDL current. Valence band holes, left behind by the tunneling process, are then free to transport into the body region of the device 100 under the influence of the lateral electric field ($E_y$), as shown in FIGS. 4A and 6, thus completing the path 152 for GIDL current. Referring back to FIG. 4A, when GIDL occurs during an ESD event, the GIDL current path is completed as electrons move towards drain contact region 114 and holes move towards P+ collection region 102. Referring to FIGS. 3 and 4A, during an ESD event, a significant GIDL hole current flows to P+ collection region 102 becomes the base current of the NPN bipolar junction transistor structure 180 which is formed by drain contact region 114, P-substrate 118/P well region 124 and source contact region. In one embodiment, NPN bipolar junction transistor structure 180 which is turned on during an ESD event by the GIDL current will allow the ESD clamp 100 to conduct a large current before the drain junction breakdown occurs (i.e. bipolar snapback) which may happen at a supply voltage far exceeds the operational range of ESD clamp 100. As illustrated in FIG. 4A, there is a voltage drop from drain contact region 114 to gate edge region 150 where most GIDL event occurs. In one embodiment, since N well region 122 is more heavily doped than deep N well region 120, as NWMOL length 130 decreases, the voltage drop will increase. As a result, the voltage at gate edge region 150 will decrease. In one embodiment, this may provide an explanation for a higher trigger voltage of ESD clamp 100 required to offset the additional voltage drop if NWMOL length 130 is reduced.

FIGS. 7A to 13B illustrates other alternative embodiments of a semiconductor structure configured to provide protection from ESD, in accordance with an embodiment of the present invention.

Figure 7A:
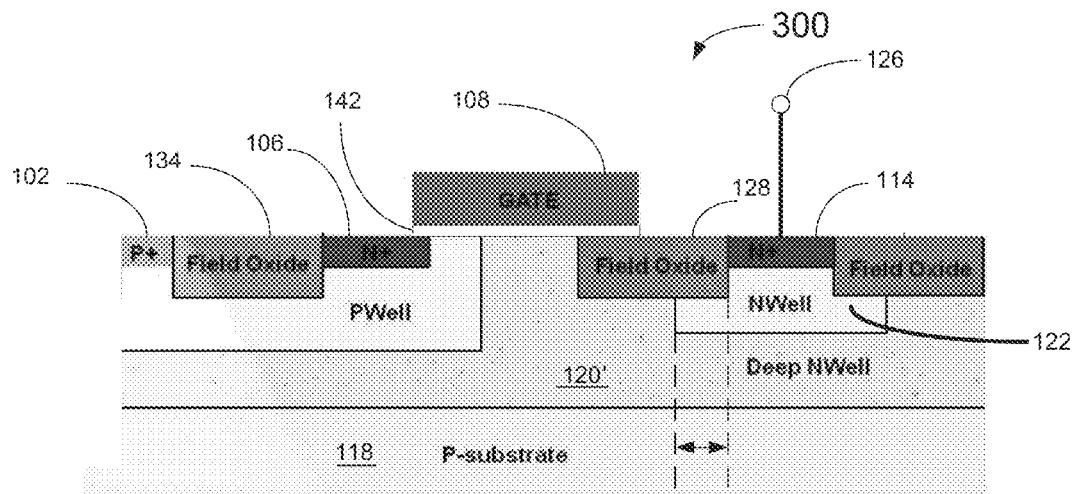
FIG. 7A illustrates a cross-sectional view of a semiconductor structure configured to provide protection from ESD, in accordance with an embodiment of the present invention.
Figure 7B:
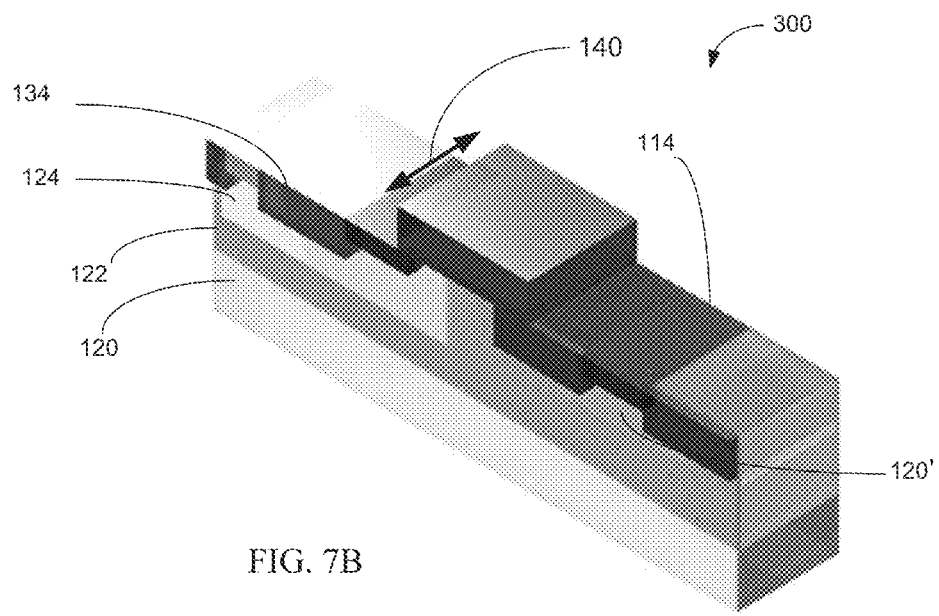
FIG. 7B illustrates an isometric view thereof.

As illustrated in FIGS. 7A and 7B, ESD device 300 is a N-channel DEMOS transistor based device resembles ESD clamp 100 as depicted in FIGS. 3, 4A and 4B. The only difference is that deep N well 120' is extended to isolate P well 124 from P-substrate 118. As a result, source contact region 106 is isolated from P-substrate 118. In this particular embodiment, N well 122 is used to change the electric field in the device 300 at the gate-to-deep N well overlap.

Figure 8A:
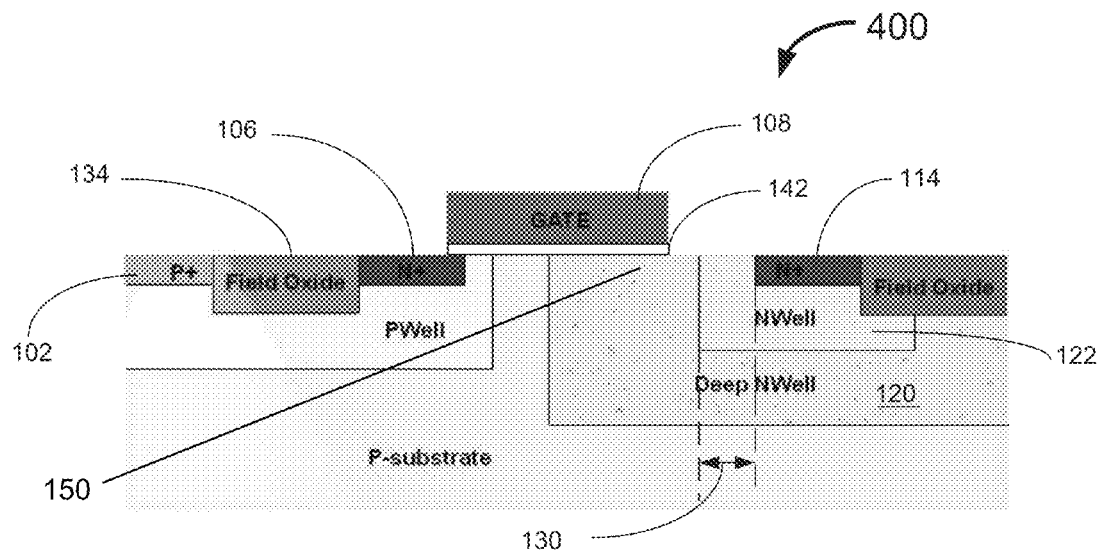
FIG. 8A illustrates a cross-sectional view of a semiconductor structure configured to provide protection from ESD, in accordance with an embodiment of the present invention.
Figure 8B:
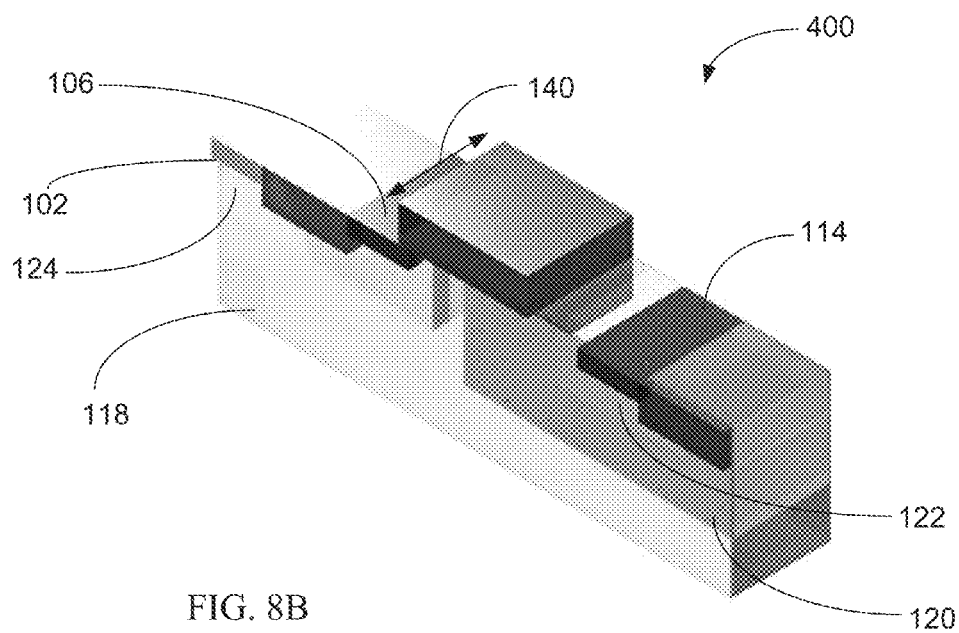
FIG. 8B illustrates an isometric view thereof.

As illustrated in FIGS. 8A and 8B, ESD device 400 is a N-channel DEMOS transistor based device resembles ESD clamp 100 as depicted in FIGS. 3, 4A and 4B. The only difference is that field oxide isolation structure 128 is omitted. As a result, more silicon volume in the drain extension area is available for current conduction and a better heat dissipation is allowed during ESD events. In one embodiment, ESD device 400 may be used for lower voltage applications. In this particular embodiment, N well 122 is used to change the electric field in the device 400 at the gate-to-deep N well overlap.

Figure 9A:
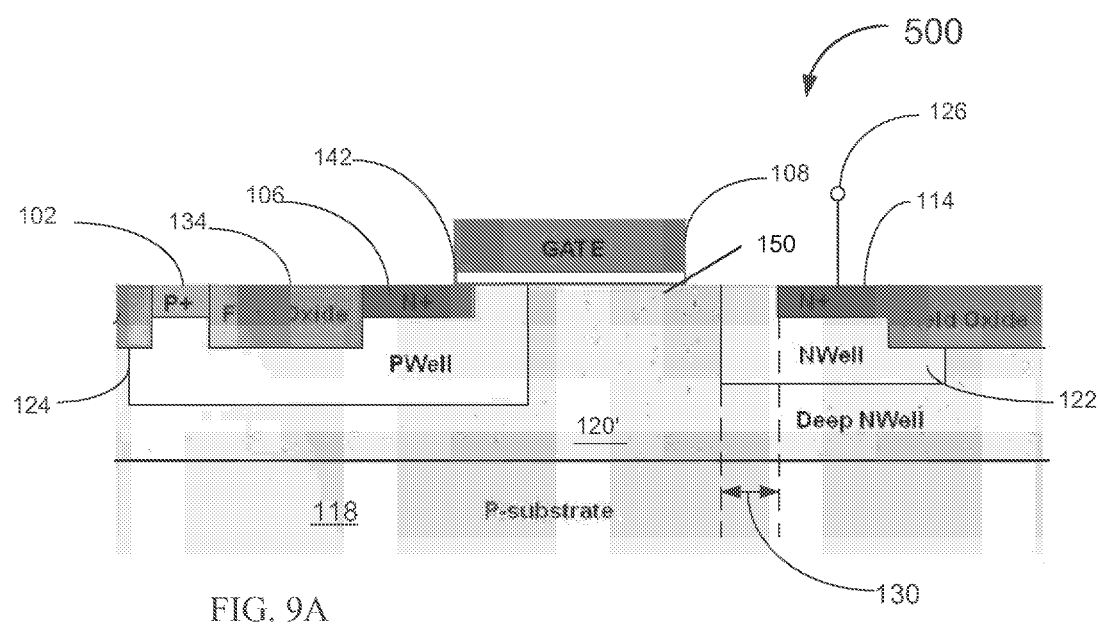
FIG. 9A illustrates a cross-sectional view of a semiconductor structure configured to provide protection from ESD, in accordance with an embodiment of the present invention.
Figure 9B:
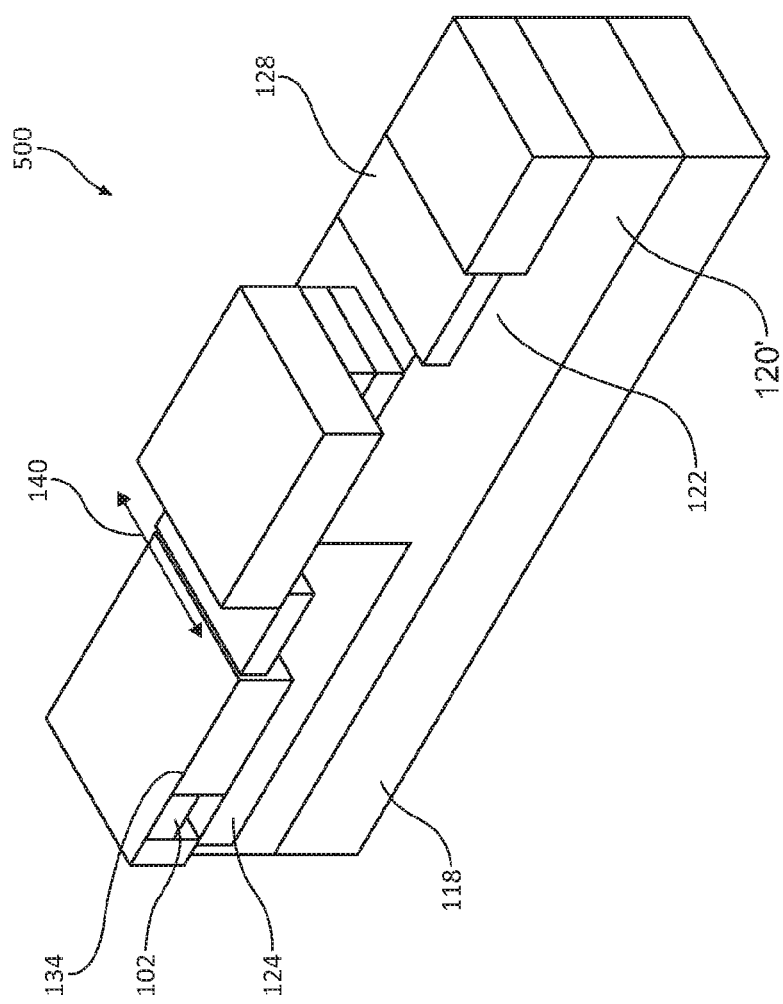
FIG. 9B illustrates an isometric view thereof.

As illustrated in FIGS. 9A and 9B, ESD device 500 is a N-channel DEMOS transistor based device resembles ESD clamp 100 as depicted in FIGS. 3, 4A and 4B. The only differences are that deep N well 120' is extended towards P well 124 and field oxide isolation structure 128 is omitted. As a result, source contact region 106 is isolated from P-substrate 118 and more silicon volume in the drain extension area is available for current conduction and a better heat dissipation is allowed during ESD events. In this particular embodiment, N well 122 is used to change the electric field in the device 500 at the gate-to-deep N well overlap.

Figure 10A:
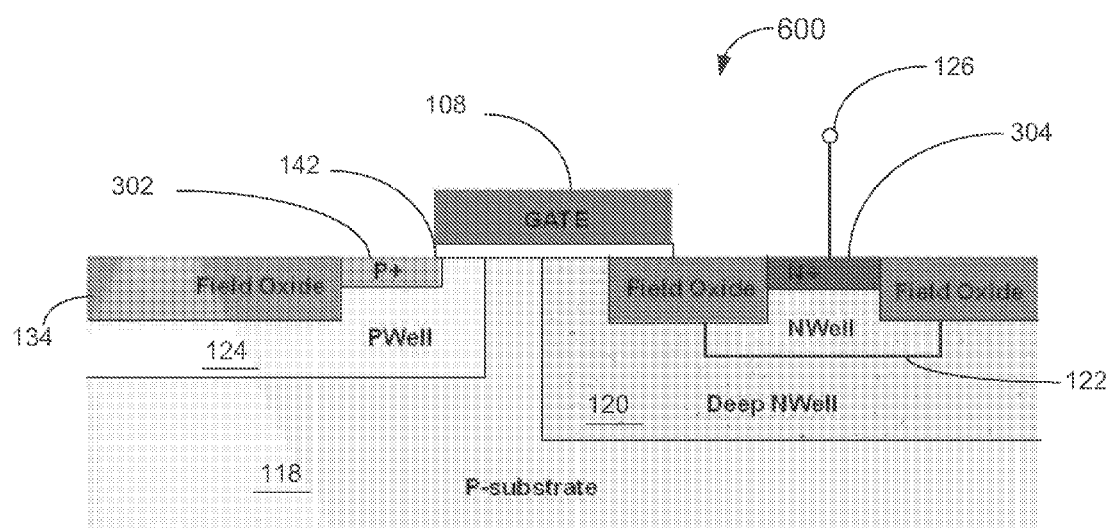
FIG. 10A illustrates a cross-sectional view of a semiconductor structure configured to provide protection from ESD, in accordance with an embodiment of the present invention.
Figure 10B:
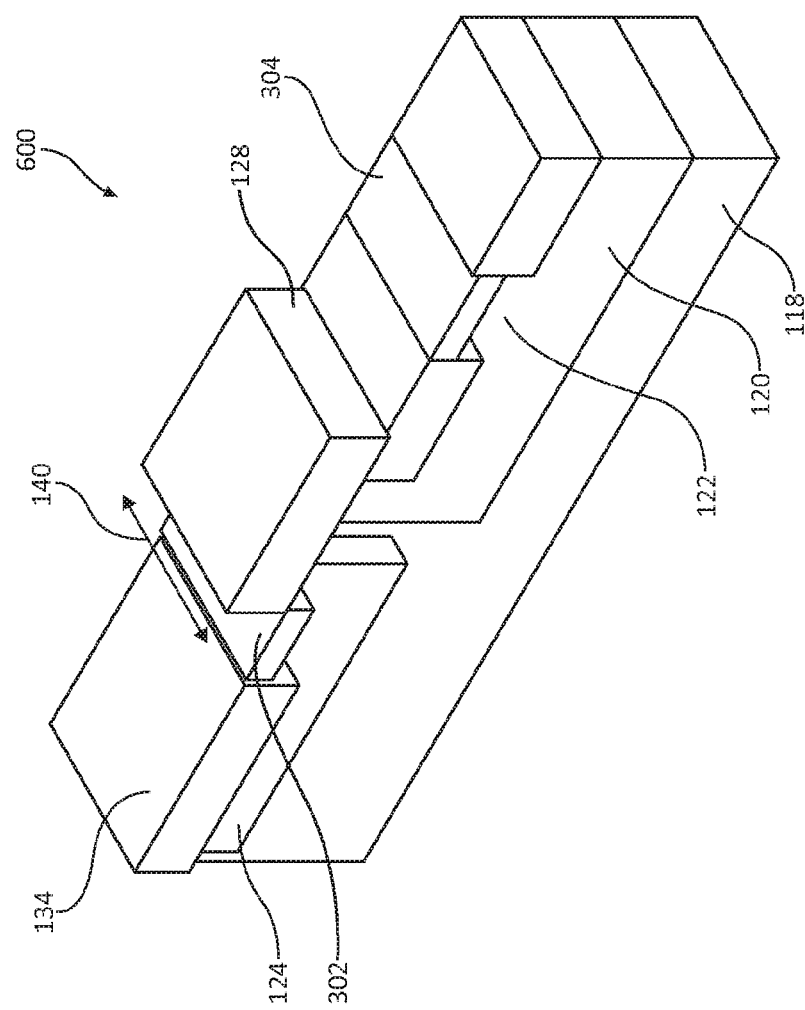
FIG. 10B illustrates an isometric view thereof.

As illustrated in FIGS. 10A and 10B, ESD device 600 is a reverse mode ESD diode based device resembles ESD clamp 100 as depicted in FIGS. 3, 4A and 4B. The only difference is that a P-type heavily doped P well pick up region 302 replaces source contact region 106. In one embodiment, P well pick up region 302 may have a doping level approximate N drain region 304 and is further coupled to $V_{SS}$ 136 to dissipate charge during both the GIDL event and ESD events. In this embodiment, P well pick up region 302 is not isolated from P-substrate 118 and N well 122 is used to change the electric field in the device 600 at the gate-to-deep N well overlap. In one embodiment, GIDL current generated during an ESD event may assist to turn on the reverse mode ESD diode 600 without break down.

Figure 11A:
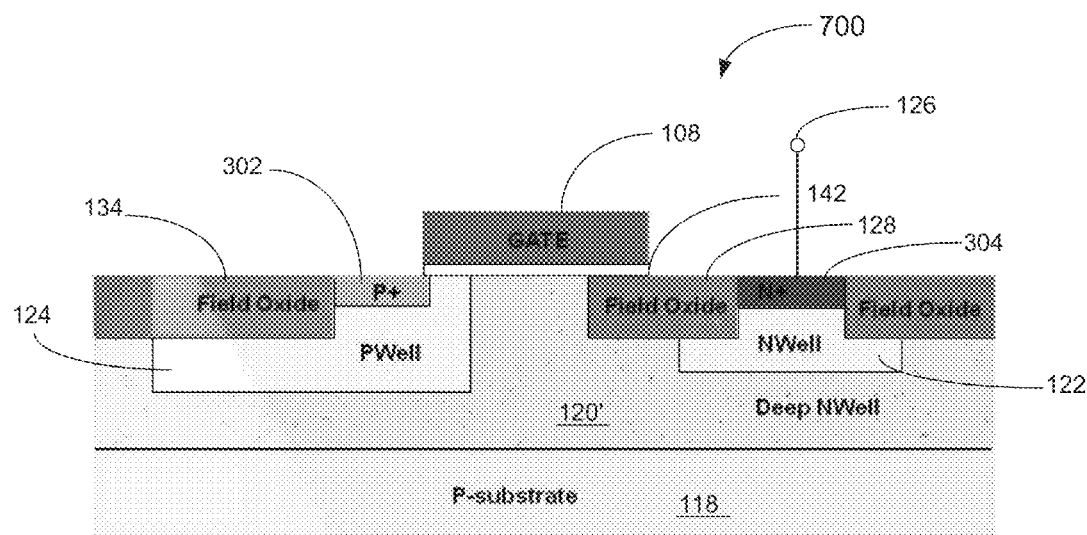
FIG. 11A illustrates a cross-sectional view of a semiconductor structure configured to provide protection from ESD, in accordance with an embodiment of the present invention.
Figure 11B:
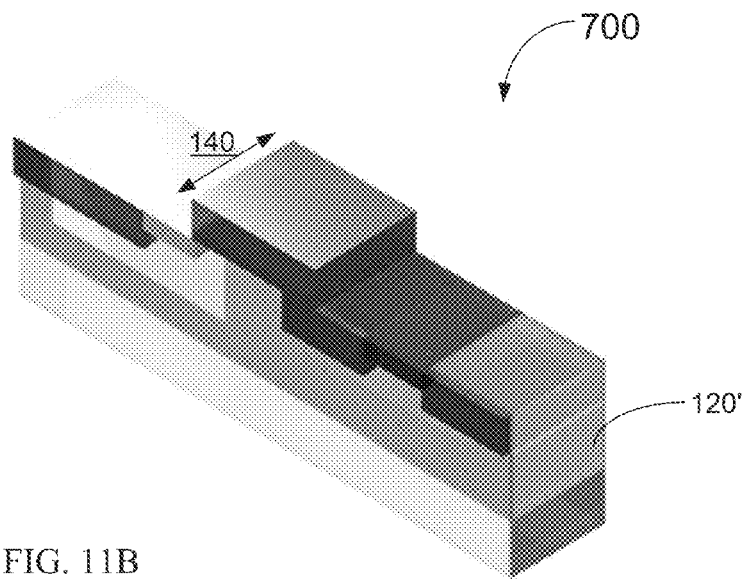
FIG. 11B illustrates an isometric view thereof.

As illustrated in FIGS. 11A and 11B, ESD device 700 is a reverse mode ESD diode based device resembles ESD clamp 100 as depicted in FIGS. 3, 4A and 4B. The only differences are that a P-type heavily doped P well pick up region 302 replaces source contact region 106 and deep N well 120' is extended to isolate P well 124 from P-substrate 118. In one embodiment, P well pick up region 302 is further coupled to $V_{SS}$ 136 to dissipate charge during GIDL event and ESD events. In one embodiment, P well pick up region 302 is isolated from P-substrate 118 and N well 122 is used to change the electric field in the device 700 at the gate-to-deep N well overlap.

Figure 12A:
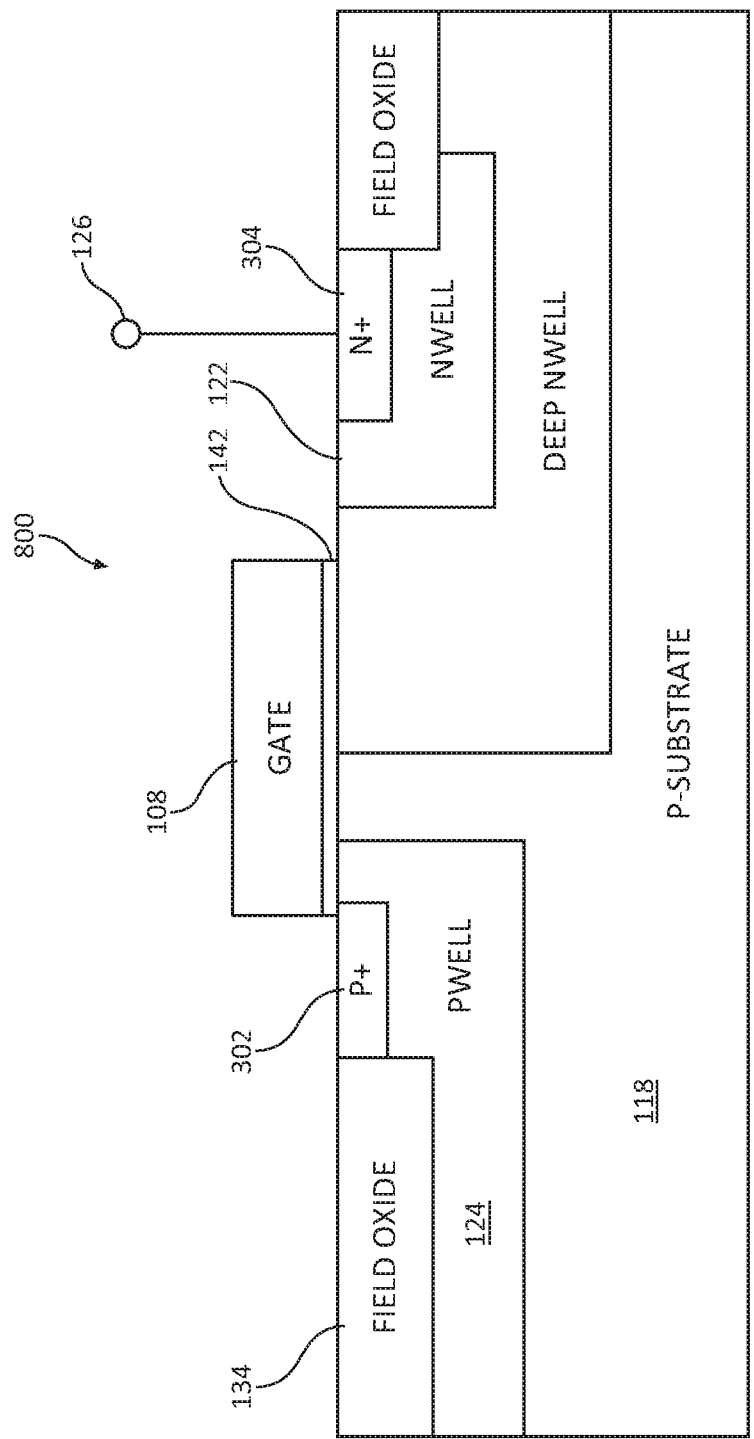
FIG. 12A illustrates a cross-sectional view of a semiconductor structure configured to provide protection from ESD, in accordance with an embodiment of the present invention.
Figure 12B:
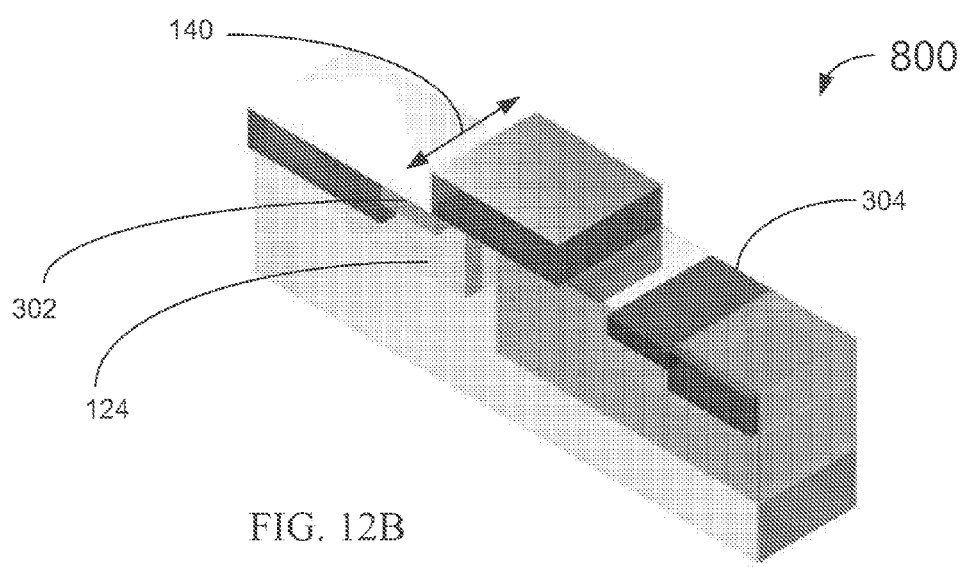
FIG. 12B illustrates an isometric view thereof.

As illustrated in FIGS. 12A and 12B, ESD device 800 is a reverse mode ESD diode based device resembles ESD clamp 100 as depicted in FIGS. 3, 4A and 4B. The only differences are that a P-type heavily doped P well pick up region 302 replaces source contact region 106 and field oxide isolation structure 128 is omitted. In one embodiment, P well pick up region 302 is further coupled to $V_{SS}$ 136 to dissipate charge during GIDL and ESD events. In one embodiment, P well pick up region 302 is not isolated from P-substrate 118. In this particular embodiment, N well 122 is used to change the electric field in the device 800 at the gate-to-deep N well overlap.

Figure 13A:
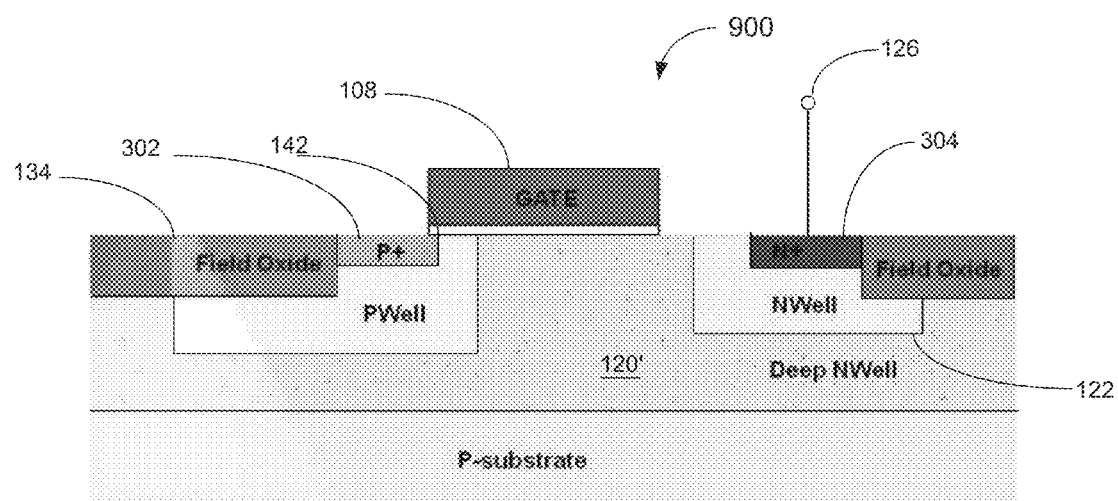
FIG. 13A illustrates a cross-sectional view of a semiconductor structure configured to provide protection from ESD, in accordance with an embodiment of the present invention.
Figure 13B:
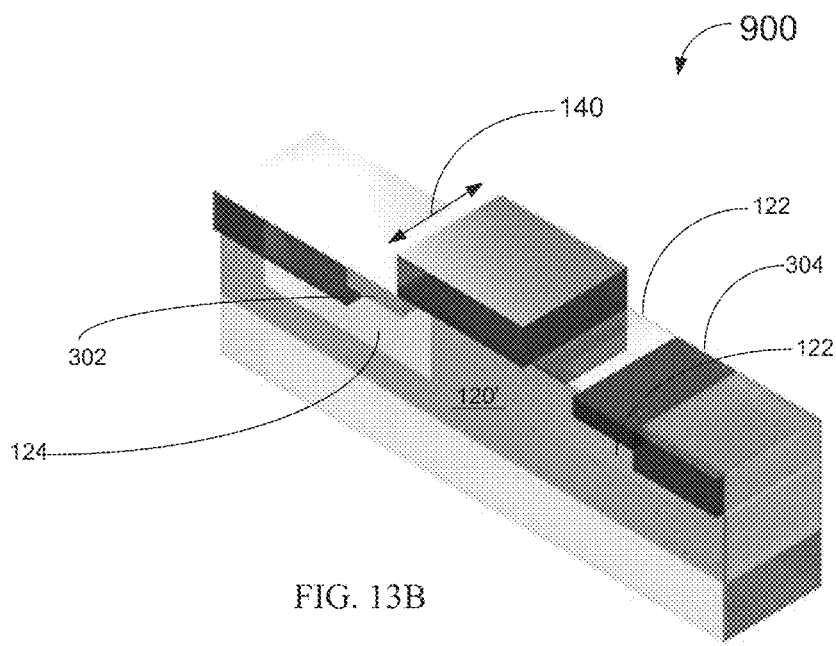
FIG. 13B illustrates an isometric view thereof.

As illustrated in FIGS. 13A and 13B, ESD device 900 is a reverse mode ESD diode based device resembles ESD clamp 100 as depicted in FIGS. 3, 4A and 4B. The only differences are that a P-type heavily doped P well pick up region 302 replaces source contact region 106, deep N well 120' is extended to isolate P well 124 from P-substrate 118, and field oxide isolation structure 128 is omitted. In one embodiment, P well pick up region 302 is further coupled to $V_{SS}$ 136 to dissipate charge during GIDL and ESD events and field oxide isolation structure 128 is omitted. In one embodiment, P well pick up region 302 is isolated from P-substrate 118. In this particular embodiment, N well 122 is used to change the electric field in the device 900 at the gate-to-deep N well overlap.

Figure 14A:
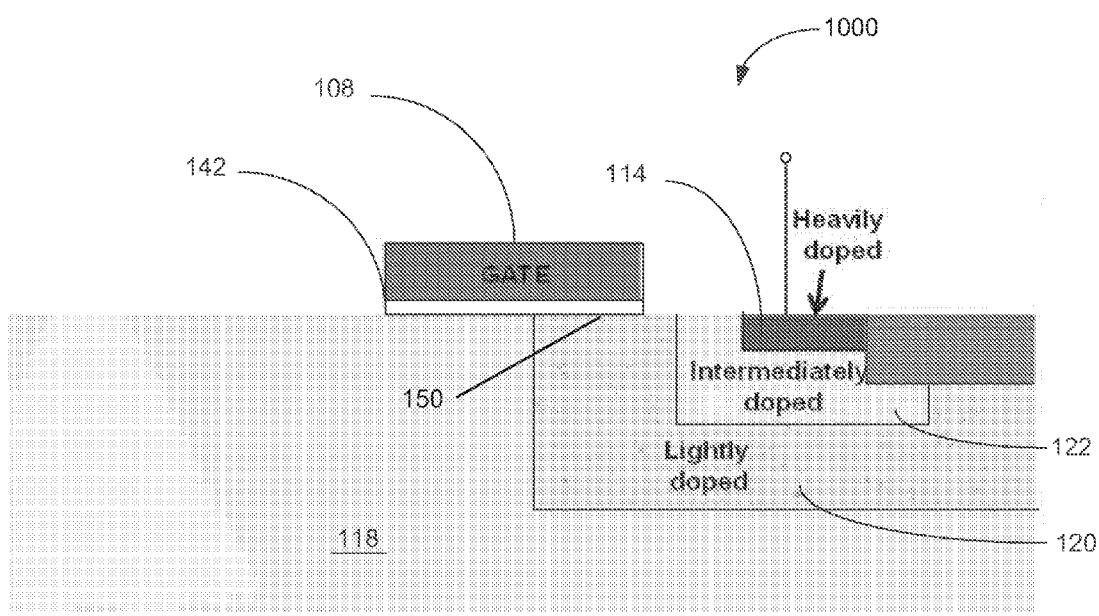
FIG. 14A illustrates a cross-sectional view of a semiconductor structure configured to provide protection from ESD, in accordance with an embodiment of the present invention.
Figure 14B:
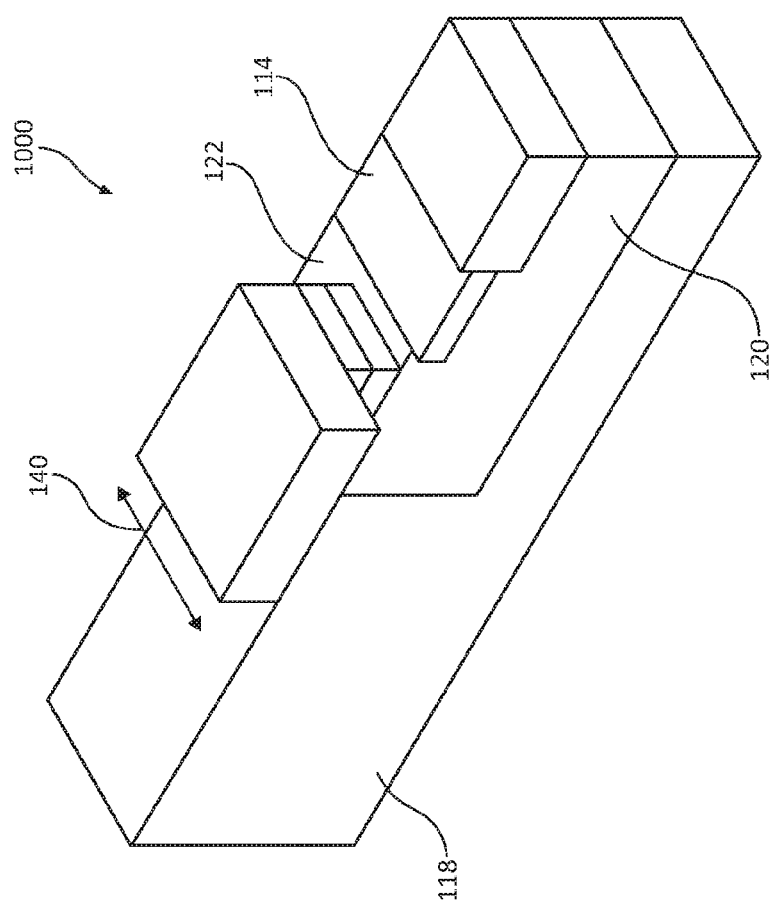
FIG. 14B illustrates an isometric view thereof.

FIGS. 14A and 14B illustrate a common feature of ESD clamp 100 and alternative embodiments as depicted in FIGS. 3-4B and 7A-13B. As illustrated in FIG. 14A, heavily doped drain contact region 114 is formed within intermediately doped N well region 122, which in turn is formed within lightly doped deep N well region 120. In one embodiment, intermediately doped N well region 122 is used to change the field in the device 100 where gate 108 overlaps with lightly doped deep N well region 120. Also, as explained above, NWMOL 130 length is adjusted in order to manipulate voltage drop from drain contact region 114 to gate edge region 150, which in turn will control the trigger and holding voltages of ESD clamp 100, as depicted in FIGS. 3, 4A and 4B and all alternative embodiments 200-900 in FIGS. 4C, 7-14A&B.

In alternative embodiments, ESD clamps and devices 100-900 depicted in FIGS. 3-4B and 7A-14B may be modified by using opposite-type dopants (P instead of N, and vice versa) in various portions of the devices. In other alternative embodiments, ESD clamps may be modified for low voltage applications.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A device, comprising:
   at least one n-channel metal-oxide-semiconductor (MOS) transistor formed on a lightly doped p-substrate, including:
   a gate,
   a heavily doped n-drain region isolated from the gate and formed at least partially within an intermediately doped n-well region, wherein the intermediately doped n-well region is formed at least partially within a lightly doped deep n-well region, the intermediately doped n-well region including at least one vertical side edge and a bottom edge that are in direct contact with the lightly doped deep n-well region, wherein doping levels of the n-drain region, the n-well region and the deep n-well region are in a descending order, and
   a heavily doped n-source region; and
   a heavily doped p-collection region spaced apart from the heavily doped n-source region, wherein the heavily doped n-source region and the heavily doped p-collection region are formed at least partially within an intermediately doped p-well region.

2. The device of claim 1, wherein a first length is defined as the horizontal distance between the heavily doped n-drain region and a side edge of the intermediately doped n-well region adjacent to the gate such that the first length is disposed between the gate and the heavily doped n-drain.

3. The device of claim 1, wherein the at least one n-channel MOS transistor is configured to provide electrostatic discharge (ESD) protection and excludes a silicon-controlled rectifier (SCR), wherein a holding voltage of the device is in an approximate range of a trigger voltage as a result.

4. The device of claim 2, wherein the first length is configured to determine a trigger and a holding voltage of the device, wherein the trigger voltage and the holding voltage of the device increase when the first length decreases, and vice versa.

5. The device of claim 1, wherein two n-channel MOS transistors are disposed side by side and coupled to one another at the shared heavily doped n-drain region.

6. The device of claim 1, further comprising:
   a gate induced drain leakage (GIDL) current path when a supply voltage to the device reaches at least a trigger voltage, wherein the GIDL current path further includes a first terminal and a second terminal,
   wherein negative charge generated moves from a first region underneath the gate to the first terminal via the intermediately doped n-well region and positive charge generated moves from the first region to the second terminal, and wherein the second terminal is further coupled to a ground node, and
   wherein the first terminal is the heavily doped n-drain region and the second terminal is the heavily doped p-collection region.

7. The device of claim 6, wherein the GIDL current turns on a bipolar junction transistor (BJT) structure as a base current, wherein the BJT structure is formed by the heavily doped n-source region, the lightly doped p-substrate and the heavily doped n-drain region which provides a low impedance circuit to dissipate ESD charge.

8. The device of claim 1, wherein a first field oxide is disposed between the gate and the heavily doped n-drain region, wherein the first field oxide has a length in an approximate range of 3 µm, and wherein the first length represents an overlapping distance of the first field oxide and the intermediately doped n-well region.

9. The device of claim 1, wherein a second field oxide is disposed between the heavily doped p-collection region and the heavily doped n-source region.

10. The device of claim 1, wherein the lightly doped deep n-well region is extended towards the heavily doped p-collection region until the heavily doped n-source region is isolated from the lightly doped p-substrate.

11. A device, comprising:
    a reverse mode ESD diode formed on a lightly doped p-substrate, including:
    a gate,
    a heavily doped n-cathode and a heavily doped p-anode disposed on opposite sides of the gate, wherein
    the heavily doped n-cathode is isolated from the gate and formed at least partially within an intermediately doped n-well region, wherein the intermediately doped n-well region is formed at least partially within a lightly doped deep n-well region, the intermediately doped n-well region including at least one vertical side edge and a bottom edge that are in direct contact with the lightly doped deep n-well region, wherein doping levels of the n-cathode, the n-well region and the deep n-well region are in a descending order, and
    the heavily doped p-anode formed at least partially within an intermediately doped p-well region.

12. The device of claim 11, wherein a first length is defined as the horizontal distance between the heavily doped n-cathode and a side edge of the intermediately doped n-well region adjacent to the gate such that the first length is disposed between the gate and the heavily doped n-cathode, and wherein the first length is configured to determine a trigger voltage of the device.

13. The device of claim 12, wherein the reverse mode ESD diode is configured to provide ESD protection and exclude a SCR structure, and wherein a holding voltage of the device is in an approximate range of the trigger voltage as a result.

14. The device of claim 13, wherein the trigger voltage and the holding voltage of the device increase when the first length decreases, and vice versa.

15. The device of claim 11, further comprising:
a GIDL current path further includes a first terminal and a second terminal,
wherein a GIDL event takes place when a supply voltage to the first terminal reaches at least a trigger voltage of the device, wherein negative charge generated during the GIDL event moves from a first region underneath the gate to the first terminal via the intermediately doped N-well region and positive charge generated moves from the first region to the second terminal which is further coupled to a ground node, and
wherein the first terminal is the heavily doped n-cathode and the second terminal is the heavily doped p-anode.

16. The device of claim 11, wherein a first field oxide is disposed between the gate and the heavily doped n-cathode, and wherein the first length represents an overlapping distance of the first field oxide and the intermediately doped n-well region.

17. The device of claim 11, wherein the lightly doped deep N-well region is extended towards the heavily doped p-anode until the heavily doped p-anode is isolated from the lightly doped p-substrate.

18. A method, comprising:
providing an ESD clamp including:
a n-channel DEMOS transistor wherein a heavily doped n-drain region is isolated from a gate and formed at least partially within an intermediately doped n-well region, wherein the intermediately doped n-well region is formed at least partially within a lightly doped deep n-well region, the intermediately doped n-well region including at least one vertical side edge and a bottom edge that are in direct contact with the lightly doped deep n-well region, wherein doping levels of the n-drain region, the n-well region and the deep n-well region are in a descending order, wherein a first length is defined as the horizontal distance between the heavily doped n-drain region and the vertical side edge of the intermediately doped n-well region adjacent to the gate, and
a heavily doped p-collection region spaced apart from the heavily doped n-source region, wherein the heavily doped n-source region and the heavily doped p-collection region are formed at least partially within an intermediately doped p-well region;
coupling the heavily doped n-drain region to a first node, wherein the first node is further coupled to an active circuit including an operational voltage and a breakdown voltage;
coupling the heavily doped n-source and p-collection regions and the gate to a ground node;
configuring the ESD clamp by selecting the first length wherein the first length determines a trigger voltage and a holding voltage of the ESD clamp; and
selecting the holding voltage of the ESD clamp above the operational voltage and the trigger voltage below the breakdown voltage.

19. The method of claim 18, wherein the trigger voltage and the holding voltage of the ESD clamp are in a same approximate range.

20. The method of claim 18, wherein the trigger voltage and the holding voltage of the ESD clamp decrease as the first length increases and vice versa.

* * * * *